United States Patent
Kimura et al.

(10) Patent No.: US 8,169,121 B2
(45) Date of Patent: *May 1, 2012

(54) SURFACE ACOUSTIC WAVE DEVICE INCLUDING ELECTRODE FINGERS PARTIALLY DISPOSED IN GROOVES IN A PIEZOELECTRIC SUBSTRATE

(75) Inventors: Tetsuya Kimura, Nagaokakyo (JP); Michio Kadota, Nagaokakyo (JP)

(73) Assignee: Murata Manufactoring Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/161,029

(22) Filed: Jun. 15, 2011

(65) Prior Publication Data

US 2011/0241481 A1    Oct. 6, 2011

Related U.S. Application Data

(63) Continuation of application No. PCT/JP2009/006339, filed on Nov. 25, 2009.

(30) Foreign Application Priority Data

Dec. 17, 2008    (JP) .................................. 2008-321198

(51) Int. Cl.
*H03H 9/25* (2006.01)
*H01L 41/04* (2006.01)
(52) U.S. Cl. ................................ 310/313 B; 310/313 R
(58) Field of Classification Search .................... 310/313
See application file for complete search history.

(56) References Cited

U.S. PATENT DOCUMENTS

| 5,130,257 | A | * | 7/1992 | Baer et al. .................... 436/151 |
| 5,434,465 | A | | 7/1995 | Sato et al. |
| 7,425,788 | B2 | * | 9/2008 | Kadota et al. ............. 310/313 B |
| 7,564,174 | B2 | * | 7/2009 | Matsuda et al. ............. 310/346 |
| 7,737,603 | B2 | * | 6/2010 | Kando ....................... 310/313 R |
| 7,876,021 | B2 | * | 1/2011 | Kadota et al. ............. 310/313 B |
| 7,956,511 | B2 | * | 6/2011 | Kadota et al. ............. 310/313 B |
| 7,956,512 | B2 | * | 6/2011 | Kadota et al. ............. 310/313 B |
| 2007/0120439 | A1 | | 5/2007 | Kadota et al. |
| 2009/0189483 | A1 | * | 7/2009 | Kadota et al. ............. 310/313 B |

FOREIGN PATENT DOCUMENTS

| JP | 63-238708 A | 10/1988 |
| JP | 06-112763 A | 4/1994 |
| JP | 2006-270906 A | 10/2006 |
| WO | 2006/011417 A1 | 2/2006 |
| WO | 2008/149620 A1 | 12/2008 |

\* cited by examiner

OTHER PUBLICATIONS

Official Communication issued in International Patent Application No. PCT/JP2009/006339, mailed on Dec. 28, 2009.

*Primary Examiner* — Jaydi San Martin
(74) *Attorney, Agent, or Firm* — Keating & Bennett, LLP

(57) ABSTRACT

A surface acoustic wave device has a large electromechanical coupling coefficient, a low insertion loss, and high resistance to static electricity. In the surface acoustic wave device, a piezoelectric substance includes a plurality of grooves. Each electrode finger of an IDT electrode includes a first electrode layer disposed in the grooves and a second electrode layer disposed on the first electrode layer and located at a position higher than the upper opening of the grooves. In a surface acoustic wave device, the one-half power of the product of the cube of the average density ($\rho_a$) of the first electrode layer and the average stiffness ($C44_a$) of the first electrode layer [$(\rho_a^3 \times C44_a)^{1/2}$] is larger than the one-half power of the product of the cube of the average density ($\rho_b$) of the second electrode layer and the average stiffness ($C44_b$) of the second electrode layer [$(\rho_b^3 \times C44_b)^{1/2}$].

10 Claims, 9 Drawing Sheets

SURFACE ACOUSTIC WAVE DEVICE INCLUDING ELECTRODE FINGERS PARTIALLY DISPOSED IN GROOVES IN A PIEZOELECTRIC SUBSTRATE

BACKGROUND OF THE INVENTION

1. Field of the Invention

The present invention relates to a surface acoustic wave device, for example, used for a resonator or a band-pass filter.

2. Description of the Related Art

In duplexers (DPXs) and RF filters used for mobile communication systems and other suitable systems, both a broad bandwidth and good temperature characteristics are required. As a surface acoustic wave device that has both a broad bandwidth and good temperature characteristics, for example, International Publication No. WO2006/011417 discloses a surface acoustic wave device including an IDT electrode made of Al embedded in a LiTaO$_3$ substrate. By embedding an IDT electrode in a piezoelectric substance as in the surface acoustic wave device disclosed in International Publication No. WO2006/011417, a large electromechanical coupling coefficient ($k^2$) is obtained. As a result, a broad bandwidth is achieved.

In a surface acoustic wave device in which an IDT electrode is embedded in a piezoelectric substance, in order to obtain a larger electromechanical coupling coefficient ($k^2$), it is preferable to increase the density of the IDT electrode. Furthermore, from the standpoint of decreasing the insertion loss, it is preferable to form electrode fingers of the IDT electrode with a relatively larger thickness using a low resistance material so that the resistance of the electrode fingers is decreased.

However, when the density of the IDT electrode is increased or the thickness of the IDT electrode is increased, the acoustic velocity of the surface acoustic wave tends to decrease. Therefore, when a surface acoustic wave device using a surface acoustic wave in an RF range, for example, in the range of several hundred megahertz to several gigahertz, is manufactured, it is necessary to reduce the pitch of electrode fingers of the IDT electrode. If the pitch of electrode fingers is reduced, the resistance to static electricity of the surface acoustic wave device tends to decrease.

SUMMARY OF THE INVENTION

To overcome the problems described above, preferred embodiments of the present invention provide a surface acoustic wave device which has a large electromechanical coupling coefficient ($k^2$), a low insertion loss, and high resistance to static electricity.

A surface acoustic wave device according to a preferred embodiment of the present invention includes a piezoelectric substance and an IDT electrode. The piezoelectric substance is preferably provided with a plurality of grooves. The IDT electrode includes a plurality of electrode fingers. The electrode fingers are preferably partially disposed in the grooves. Each of the electrode fingers preferably includes a first electrode layer and a second electrode layer. The first electrode layer is disposed in the grooves. The second electrode layer is disposed on the first electrode layer. The second electrode layer is preferably located at a position higher than the upper opening of the grooves. In the surface acoustic wave device according to a preferred embodiment of the present invention, the one-half power of the product of the cube of the average density ($\rho_a$) of the first electrode layer and the average stiffness ($C44_a$) of the first electrode layer [$(\rho_a^3 \times C44_a)^{1/2}$] is preferably greater than the one-half power of the product of the cube of the average density ($\rho_b$) of the second electrode layer and the average stiffness ($C44_b$) of the second electrode layer [$(\rho_b^3 \times C44_b)^{1/2}$].

According to a preferred embodiment of the present invention, the relationship $(\rho_b^3 \times C44_b)^{1/2} < 6.54 \times 10^{10} \leq (\rho_a^3 \times C44_a)^{1/2}$ is preferably satisfied. In this case, it is possible to further decrease the insertion loss and to further increase the resistance to static electricity.

According to another preferred embodiment of the present invention, the relationship $(\rho_a^3 \times C44_a)^{1/2} < 5.0 \times 10^{11}$ is preferably satisfied. In this case, it is possible to further decrease the insertion loss and to further increase the resistance to static electricity.

According to another preferred embodiment of the present invention, the second electrode layer is preferably substantially made of Al or an alloy containing Al as a main component, for example.

According to another preferred embodiment of the present invention, the first electrode layer is preferably substantially made of a metal selected from the group consisting of Ti, Cu, Ag, Cr, Ni, Mo, and Au, or an alloy containing at least one metal selected from the group as a main component, for example.

According to another preferred embodiment of the present invention, the first electrode layer is preferably substantially made of Cu, Ti, Ni, or NiCr, for example.

According to another preferred embodiment of the present invention, at least one of the first electrode layer and the second electrode layer preferably includes a plurality of metal films. In the case where the first electrode layer includes a plurality of metal films, the average density ($\rho_a$) of the first electrode layer corresponds to a value obtained by dividing the sum of the products of the density and the thickness of each metal film defining the first electrode layer by the sum of the thickness of each metal film. The average stiffness ($C44_a$) of the first electrode layer corresponds to a value obtained by dividing the sum of the products of the average stiffness and the thickness of each metal film defining the first electrode layer by the sum of the thickness of each metal film. In the case where the second electrode layer includes a plurality of metal films, the average density ($\rho_b$) of the second electrode layer corresponds to a value obtained by dividing the sum of the products of the density and the thickness of each metal film defining the second electrode layer by the sum of the thickness of each metal film. The average stiffness ($C44_b$) of the second electrode layer corresponds to a value obtained by dividing the sum of the products of the average stiffness and the thickness of each metal film defining the second electrode layer by the sum of the thickness of each metal film.

In preferred embodiments of the present invention, the "metal film" includes a film substantially made of an alloy.

According to another preferred embodiment of the present invention, the piezoelectric substance is preferably a LiTaO$_3$ substrate or a LiNbO$_3$ substrate, for example.

According to another preferred embodiment of the present invention, the piezoelectric substance is preferably a LiTaO$_3$ substrate, for example.

According to another preferred embodiment of the present invention, $\theta$ of the Euler angles ($\phi$, $\theta$, $\Psi$) of the LiTaO$_3$ substrate is preferably about 120° to about 140°, for example.

In the surface acoustic wave device according to various preferred embodiments of the present invention, the one-half power of the product of the cube of the average density ($\rho_a$) and the average stiffness ($C44_a$) of the first electrode layer located inside the groove [$(\rho_a^3 \times C44_a)^{1/2}$] is preferably greater than the one-half power of the product of the cube of the average density ($\rho_b$) and the average stiffness ($C44_b$) of the second electrode layer located at a position higher than the upper opening of the groove $[(\rho_b{}^3 \times C44_b)^{1/2}]$. Therefore, it is possible to provide a surface acoustic wave device which has a large electromechanical coupling coefficient ($k^2$), a low insertion loss, and high resistance to static electricity.

The above and other elements, features, steps, characteristics, and advantages of the present invention will become more apparent from the following detailed description of the preferred embodiments with reference to the attached drawings.

BRIEF DESCRIPTION OF THE DRAWINGS

In FIG. 7, the rhombus denoted by numeral 126 represents the data in the case where θ of the Euler angles is about 126°. In FIG. 7, the data denoted by numeral 130 is the data in the case where θ of the Euler angles is about 130°. In FIG. 7, the square denoted by numeral 136 represents the data in the case where θ of the Euler angles is about 136°.

DETAILED DESCRIPTION OF THE PREFERRED EMBODIMENTS

Preferred embodiments of the present invention will be described with reference to the drawings.

Figure 1:
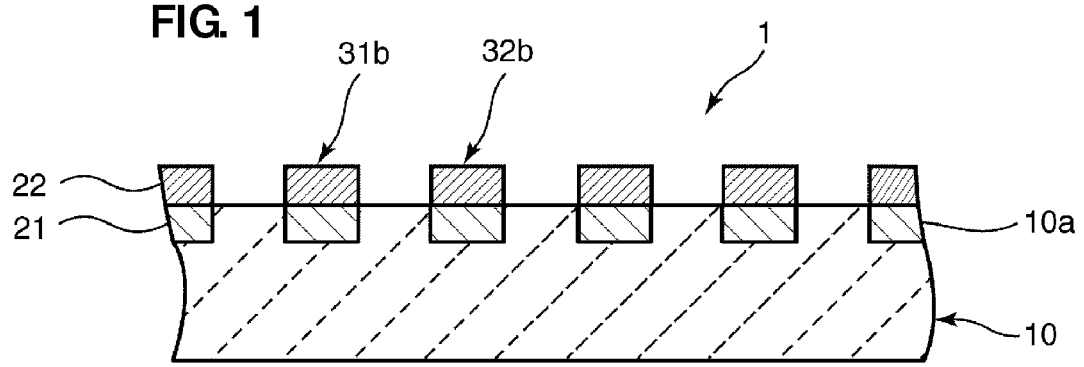
FIG. 1 is a schematic cross-sectional view of a surface acoustic wave device according to a preferred embodiment of the present invention.
Figure 2:
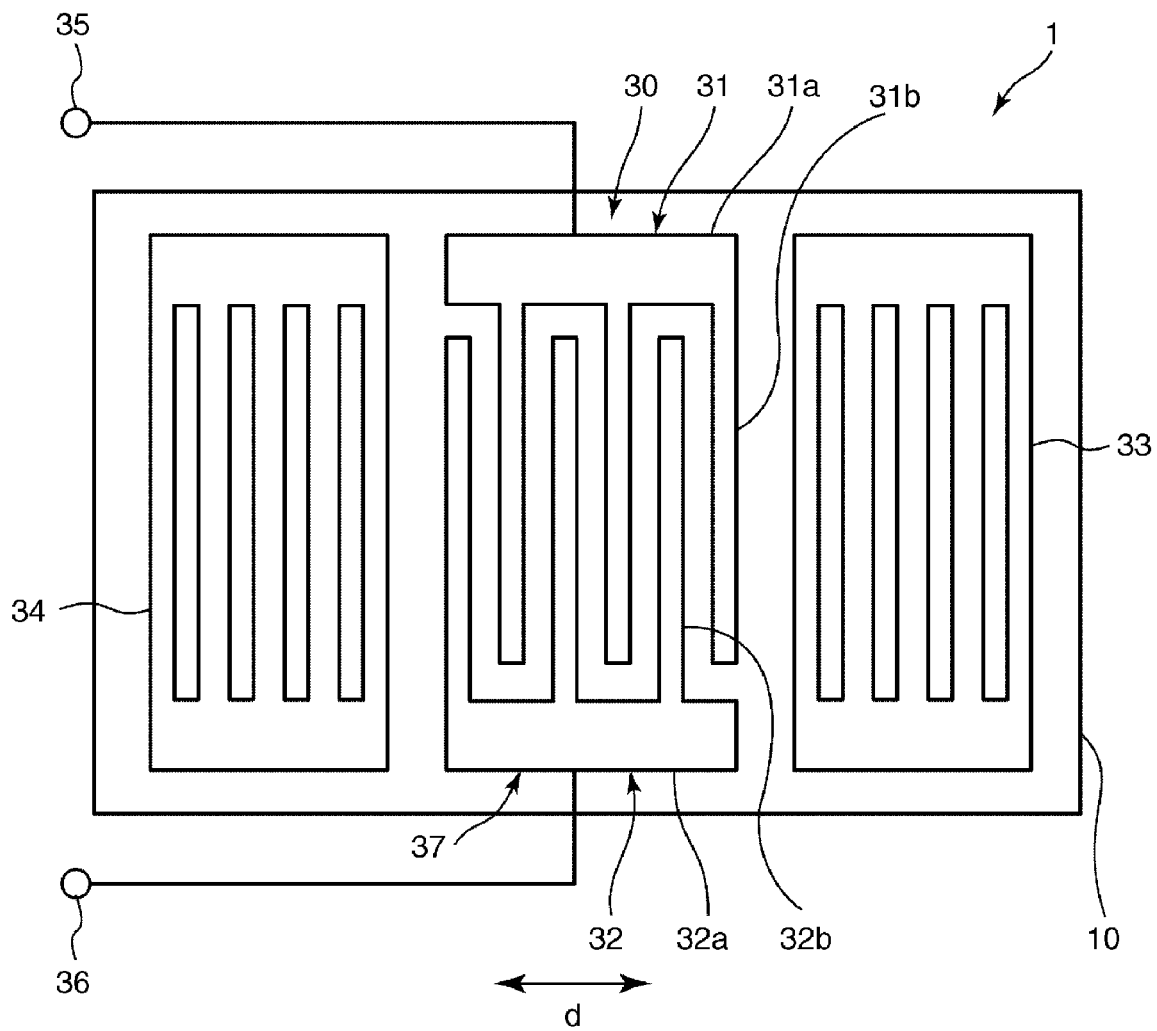
FIG. 2 is a schematic plan view of the surface acoustic wave device according to a preferred embodiment of the present invention.

FIG. 1 is a schematic cross-sectional view of a surface acoustic wave device 1 according to a preferred embodiment of the present invention. FIG. 2 is a schematic plan view of the surface acoustic wave device 1 according to the present preferred embodiment. As shown in FIGS. 1 and 2, the surface acoustic wave device 1 includes a piezoelectric substance 10. The piezoelectric substance 10 can be made of an appropriate piezoelectric material. Specifically, the piezoelectric substance 10 can be made of, for example, a $LiTaO_3$ substrate, a $LiNbO_3$ substrate, or other suitable material. In particular, the piezoelectric substance 10 is preferably made of a $LiTaO_3$ substrate. More particularly, the piezoelectric substance 10 is more preferably made of a $LiTaO_3$ substrate in which θ of the Euler angles (φ, θ, Ψ) is about 120° to about 140°, for example. Still more particularly, the piezoelectric substance 10 is more preferably made of a $LiTaO_3$ substrate having Euler angles of (0±5°, 120° to 140°, 0±5°), for example.

As shown in FIG. 2, an electrode 30 is provided on the piezoelectric substance 10. The electrode 30 includes an IDT electrode 37. Reflectors 33 and 34 are disposed on both sides, in the propagation direction d of the surface acoustic wave, of the IDT electrode 37. The IDT electrode 37 includes a first comb-shaped electrode 31 and a second comb-shaped electrode 32 which are interdigitally arranged. The first comb-shaped electrode 31 is electrically connected to a first terminal 35, and the second comb-shaped electrode 32 is electrically connected to a second terminal 36.

The first comb-shaped electrode 31 includes a first busbar 31a and a plurality of first electrode fingers 31b connected to the first busbar 31a. The plurality of first electrode fingers 31b are arranged substantially parallel to each other. The second comb-shaped electrode 32 includes a second busbar 32a and a plurality of second electrode fingers 32b connected to the second busbar 32a. The plurality of second electrode fingers 32b are arranged substantially parallel to each other. The plurality of second electrode fingers 32b and the plurality of first electrode fingers 31b are alternately arranged in the propagation direction d of the surface acoustic wave. The first electrode fingers 31b and the second electrode fingers 32b are preferably partially located inside a plurality of grooves 10a provided in the piezoelectric substance 10.

As shown in FIG. 1, each of the first electrode fingers 31b and the second electrode fingers 32b preferably includes a first electrode layer 21 and a second electrode layer 22. The first electrode layer 21 is disposed in the plurality of grooves 10a provided in the piezoelectric substance 10. The surface of the first electrode layer 21 and the surface of a portion of the piezoelectric substance 10 not provided with the grooves 10a are preferably substantially flush with each other.

The second electrode layer 22 is disposed on the first electrode layer 21. The second electrode layer 22 is preferably located at a position higher than the upper opening of the groove 10a. That is, preferably, the second electrode layer 22 is not disposed inside the groove 10a, but is disposed outside the groove 10a.

In this preferred embodiment, the one-half power of the product of the cube of the average density ($\rho_a$ (kg/m$^3$)) and the average stiffness ($C44_a$ (N/m$^2$)) of the first electrode layer 21 $(\rho_a{}^3 \times C44_a)^{1/2}$ is preferably set to be greater than the one-half power of the product of the cube of the average density ($\rho_b$ (kg/m$^3$)) and the average stiffness ($C44_b$ (N/m$^2$)) of the second electrode layer 22 $[(\rho_b{}^3 \times C44_b)^{1/2}]$, namely, $[(\rho_a{}^3 \times C44_a)^{1/2} > (\rho_b{}^3 \times C44_b)^{1/2}]$. That is, in this preferred embodiment, the first electrode layer 21 having a relatively large $(\rho^3 \times C44)^{1/2}$ value is preferably embedded in the groove 10a, and the second electrode layer 22 having a relatively small $(\rho^3 \times C44)^{1/2}$ value is preferably disposed at a position higher than the upper opening of the groove 10a, where $\rho$ is the average density, and $C44$ is the average stiffness.

Thereby, as evidenced in the Examples described below, while increasing the density of the first electrode fingers 31b and the second electrode fingers 32b, the acoustic velocity of the surface acoustic wave can also be increased. Consequently, the electromechanical coupling coefficient ($k^2$) can be increased.

Furthermore, since the acoustic velocity of the surface acoustic wave can be increased, it is possible to increase the pitch (wavelength) of the first electrode fingers 31b and the second electrode fingers 32b. Consequently, the resistance to static electricity is increased. Furthermore, it is possible to improve the manufacturability of the surface acoustic wave device 1.

Furthermore, since the pitch (wavelength) of the first electrode fingers 31b and the second electrode fingers 32b can be increased, it is possible to increase the cross-sectional areas of the first electrode fingers 31b and the second electrode fingers 32b. Consequently, the resistance of the first electrode fingers 31b and the second electrode fingers 32b can be decreased. Thus, the insertion loss can be decreased.

That is, according to this preferred embodiment, it is possible to provide a surface acoustic wave device which has a large electromechanical coupling coefficient ($k^2$), a low insertion loss, and high resistance to static electricity. Note that the advantageous effects described above can be obtained regardless of the Euler angles of the piezoelectric substance 10.

In contrast, when at least a portion of the first electrode layer 21 having a large $(\rho^3 \times C44)^{1/2}$ value is disposed at a position higher than the upper opening of the groove 10a, the electromechanical coupling coefficient ($k^2$) tends to be decreased.

Furthermore, when the second electrode layer 22 having a small $(\rho^3 \times C44)^{1/2}$ value is disposed inside the groove 10a, the reflection coefficient tends to be decreased.

Furthermore, when, without providing the second electrode layer 22 having a small $(\rho^3 \times C44)^{1/2}$ value, only the first electrode layer 21 having a large $(\rho^3 \times C44)^{1/2}$ value is provided with an increased thickness so as to decrease the resistance of the first electrode fingers 31b and the second electrode fingers 32b, the acoustic velocity of the surface acoustic wave is decreased. Therefore, the pitch of the electrode fingers 31b and 32b must be decreased. Consequently, the resistance to static electricity is decreased and the manufacturability of the surface acoustic wave device is decreased.

From the standpoint of further increasing the electromechanical coupling coefficient ($k^2$), further decreasing the insertion loss, and further increasing the resistance to static electricity, preferably, the first electrode layer 21 and the second electrode layer 22 are preferably configured so as to satisfy the relationship $(\rho_b^3 \times C44_b)^{1/2} < 6.54 \times 10^{10} \leq (\rho_a^3 \times C44_a)^{1/2}$, and more preferably, so as to satisfy the relationship $(\rho_b^3 \times C44_b)^{1/2} < 6.54 \times 10^{10} \leq (\rho_a^3 \times C44_a)^{1/2} < 5.0 \times 10^{11}$.

The structure of each of the first electrode layer 21 and the second electrode layer 22 is not particularly limited as long as the relationship $(\rho_a^3 \times C44_a)^{1/2} > (\rho_b^3 \times C44_b)^{1/2}$ is satisfied. Each of the first electrode layer 21 and the second electrode layer 22 may be made of a metal film or a laminated body including a plurality of metal films.

When the first electrode layer 21 is made of a metal film, it is preferable to make the first electrode layer 21 using a metal or an alloy material having a large $(\rho^3 \times C44)^{1/2}$ value (where $\rho$ is the average density of the metal film, and C44 is the average stiffness), and it is more preferable to make the first electrode layer 21 using a metal or an alloy material having a $(\rho^3 \times C44)^{1/2}$ value of at least about $6.54 \times 10^{10}$. Specifically, preferably, the first electrode layer 21 is substantially made of a metal selected from the group consisting of Ti, Cu, Ag, Cr, Ni, Mo, and Au, or an alloy containing at least one metal selected from the group as a main component, for example. In particular, more preferably, the first electrode layer 21 is substantially made of Cu, Ti, Ni, or NiCr, for example.

When the second electrode layer 22 is made of a metal film, it is preferable to form the second electrode layer 22 using a metal or an alloy material having a small $(\rho^3 \times C44)^{1/2}$ value, and it is more preferable to form the second electrode layer 22 using a metal material having a $(\rho^3 \times C44)^{1/2}$ value of less than about $6.54 \times 10^{10}$. Specifically, preferably, the second electrode layer 22 is substantially made of Al or an alloy containing Al as a main component, for example.

When the first electrode layer 21 is made of a laminated body including a plurality of metal films, the average density ($\rho_a$ (kg/m$^3$)) of the first electrode layer 21 corresponds to a value obtained by dividing the sum of the products of the density and the thickness of each metal film defining the first electrode layer 21 by the sum of the thickness of each metal film. The average stiffness (C44$_a$ (N/m$^2$)) of the first electrode layer 21 corresponds to a value obtained by dividing the sum of the products of the average stiffness and the thickness of each metal film defining the first electrode layer 21 by the sum of the thickness of each metal film.

Furthermore, when the second electrode layer 22 is made of a laminated body including a plurality of metal films, the average density ($\rho_b$ (kg/m$^3$)) of the second electrode layer 22 corresponds to a value obtained by dividing the sum of the products of the density and the thickness of each metal film defining the second electrode layer 22 by the sum of the thickness of each metal film. The average stiffness (C44$_b$ (N/m$^2$)) of the second electrode layer 22 corresponds to a value obtained by dividing the sum of the products of the average stiffness and the thickness of each metal film defining the second electrode layer 22 by the sum of the thickness of each metal film.

Therefore, when at least one of the first electrode layer 21 and the second electrode layer 22 is made of a laminated body including a plurality of metal films, the plurality of metal films defining the first electrode layer 21 may preferably include a metal film made of a metal or an alloy material in which at least one of the density and the average stiffness is less than that of the electrode film defining the second electrode layer 22. Furthermore, the plurality of metal films defining the second electrode layer 22 may preferably include a metal film made of a metal or an alloy material in which at least one of the density and the average stiffness is larger than that of the electrode film constituting the first electrode layer 21.

Table 1 below shows $(\rho^3 \times C44)^{1/2}$ in examples of the metal material that can be used for the first electrode layer 21 and the second electrode layer 22. However, it is to be understood that the metal materials shown in Table 1 below are merely examples, and the metal or the alloy that can be used for the first electrode layer 21 and the second electrode layer 22 is not limited to the metal materials shown in Table 1.

TABLE 1

|    | Density (kg/m$^3$) ($\rho$) | Stiffness (N/m$^2$) (C44) | $(\rho^3 \times C44)^{1/2}$ |
|----|---|---|---|
| Al | $2.70 \times 10^3$ | $2.61 \times 10^{10}$ | $2.27 \times 10^{10}$ |
| Ti | $4.51 \times 10^3$ | $4.67 \times 10^{10}$ | $6.54 \times 10^{10}$ |
| Cu | $8.93 \times 10^3$ | $5.14 \times 10^{10}$ | $1.91 \times 10^{11}$ |
| Ag | $1.05 \times 10^4$ | $3.29 \times 10^{10}$ | $1.95 \times 10^{11}$ |
| Cr | $7.19 \times 10^3$ | $1.15 \times 10^{11}$ | $2.07 \times 10^{11}$ |
| Ni | $8.85 \times 10^3$ | $9.29 \times 10^{10}$ | $2.54 \times 10^{11}$ |
| Mo | $1.02 \times 10^4$ | $1.07 \times 10^{11}$ | $3.38 \times 10^{11}$ |

TABLE 1-continued

|    | Density (kg/m³) (ρ) | Stiffness (N/m²) (C44) | $(\rho^3 \times C44)^{1/2}$ |
|----|---------------------|------------------------|------------------------------|
| Au | $1.93 \times 10^4$  | $2.99 \times 10^{10}$  | $4.64 \times 10^{11}$        |
| Ta | $1.67 \times 10^4$  | $8.25 \times 10^{10}$  | $6.19 \times 10^{11}$        |
| Pt | $2.14 \times 10^4$  | $5.97 \times 10^{10}$  | $7.65 \times 10^{11}$        |
| W  | $1.93 \times 10^4$  | $1.60 \times 10^{11}$  | $1.07 \times 10^{12}$        |

Furthermore, in this preferred embodiment, although description has been made on the resonator as an example of the surface acoustic wave device, the surface acoustic wave device according to preferred embodiments of the present invention is not limited to the resonator, and may be, for example, a filter using a surface acoustic wave. Specific examples of the filter include a longitudinally coupled resonator-type filter, a ladder-type filter, and other suitable filters.

Example 1 and Comparative Examples 1 and 2

In an Example 1 of a preferred embodiment of the present invention, surface acoustic wave devices 1 shown in FIGS. 1 and 2 were fabricated as described below. The acoustic velocity, the stop band, and the fractional bandwidth at θ of the Euler angles of the piezoelectric substances 10 in the surface acoustic wave devices 1 were measured. The measurement results of the acoustic velocity are shown by solid lines in the graph of FIG. 3 and the graph of FIG. 6. The measurement results of the stop band are shown by solid lines in the graph of FIG. 9. The measurement results of the fractional bandwidth are shown by solid lines in the graph of FIG. 10.

Here, the acoustic velocity means the phase velocity (m/sec) of the surface acoustic wave.

The stop band means a range (width) in which surface acoustic waves are confined in a grating structure, and expressed as (Vsu-Vsl)/Vsl, where Vsu is the acoustic velocity at the upper end of the stop band in a short-circuit grating structure, and Vsl is the acoustic velocity at the lower end of the stop band in the short circuit grating structure. The stop band is correlated with the reflection coefficient.

The fractional bandwidth is expressed as (Vou-Vol)/Vol. The fractional bandwidth is correlated with the electromechanical coupling coefficient ($k^2$). In addition, when the stop band and the fractional bandwidth are measured, Vsu=Vou. Here, Vol is the acoustic velocity at the lower end of the stop band in an open grating structure, and Vou is the acoustic velocity at the upper end of the stop band in the open grating structure.

Conditions in Example 1
Piezoelectric substance 10: LiTaO₃ substrate having Euler angles (0°, θ, 0°)
First electrode layer 21: Cu film (($\rho^3 \times C44$)$^{1/2}$=about $1.91 \times 10^{11}$)
First electrode layer 21 thickness normalized to wavelength (h/λ): about 0.1
Second electrode layer 22: Al film (($\rho^3 \times C44$)$^{1/2}$=about $2.27 \times 10^{10}$)
Second electrode layer 22 thickness normalized to wavelength (h/λ): about 0.01 to about 0.05

Figure 3:
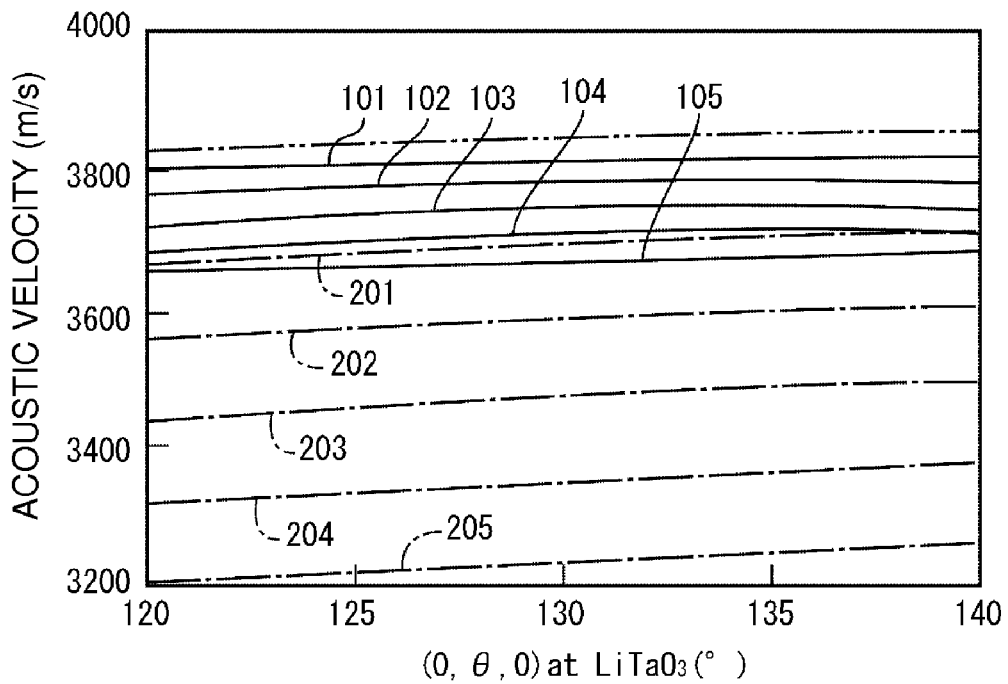
FIG. 3 is a graph showing the acoustic velocity in Example 1 and Comparative Examples 1 and 2.
Figure 4:
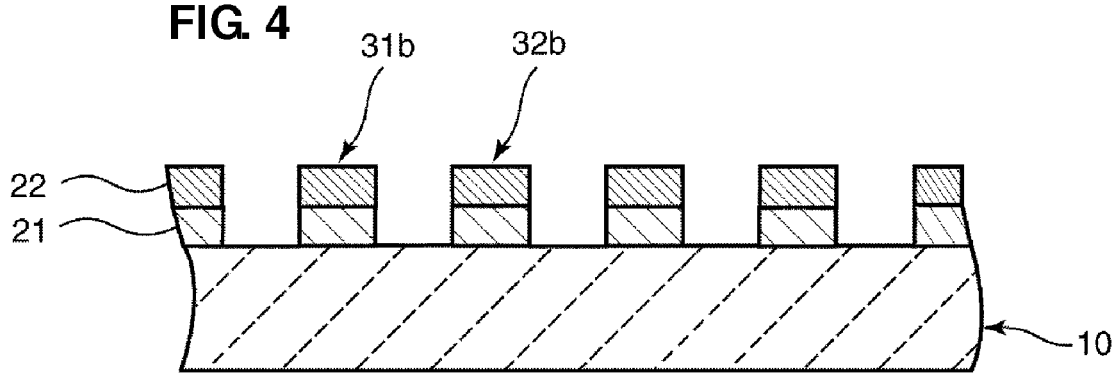
FIG. 4 is a schematic cross-sectional view of a surface acoustic wave device according to Comparative Example 1.

In Comparative Example 1, as shown in FIG. 4, surface acoustic wave devices were fabricated under the same conditions as those in Example 1, except that grooves were not provided in the piezoelectric substance 10 and the first electrode layer 21 and the second electrode layer 22 were formed on the piezoelectric substance 10. The acoustic velocity, the stop band, and the fractional bandwidth at θ of the Euler angles of the piezoelectric substances 10 in the surface acoustic wave devices 1 were measured. The measurement results of the acoustic velocity are shown by dashed-dotted lines in the graph of FIG. 3 and the graph of FIG. 6. The measurement results of the stop band are shown by dashed-dotted lines in the graph of FIG. 9. The measurement results of the fractional bandwidth are shown by dashed-dotted lines in the graph of FIG. 10.

Figure 5:
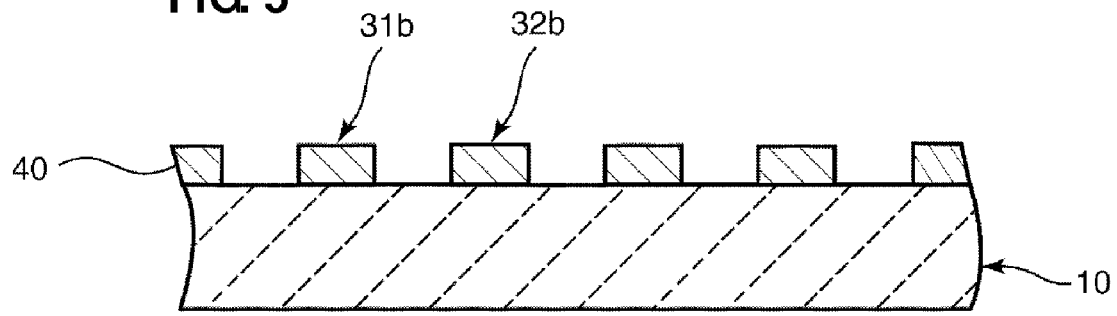
FIG. 5 is a schematic cross-sectional view of a surface acoustic wave device according to Comparative Example 2.

In Comparative Example 2, as shown in FIG. 5, a surface acoustic wave device was fabricated under the same conditions as those in Example 1, except that grooves were not provided in the piezoelectric substance 10 and an Al electrode layer 40 having a thickness normalized to wavelength of about 0.1 was formed on the piezoelectric substance 10. The acoustic velocity, the stop band, and the fractional bandwidth at θ of the Euler angles of the piezoelectric substance 10 in the surface acoustic wave device 1 were measured. The measurement results of the acoustic velocity are shown by a dashed-two-dotted line in the graph of FIG. 3. The measurement results of the stop band are shown by a dashed-two-dotted line in the graph of FIG. 9. The measurement results of the fractional bandwidth are shown by a dashed-two-dotted line in the graph of FIG. 10.

Figure 9:
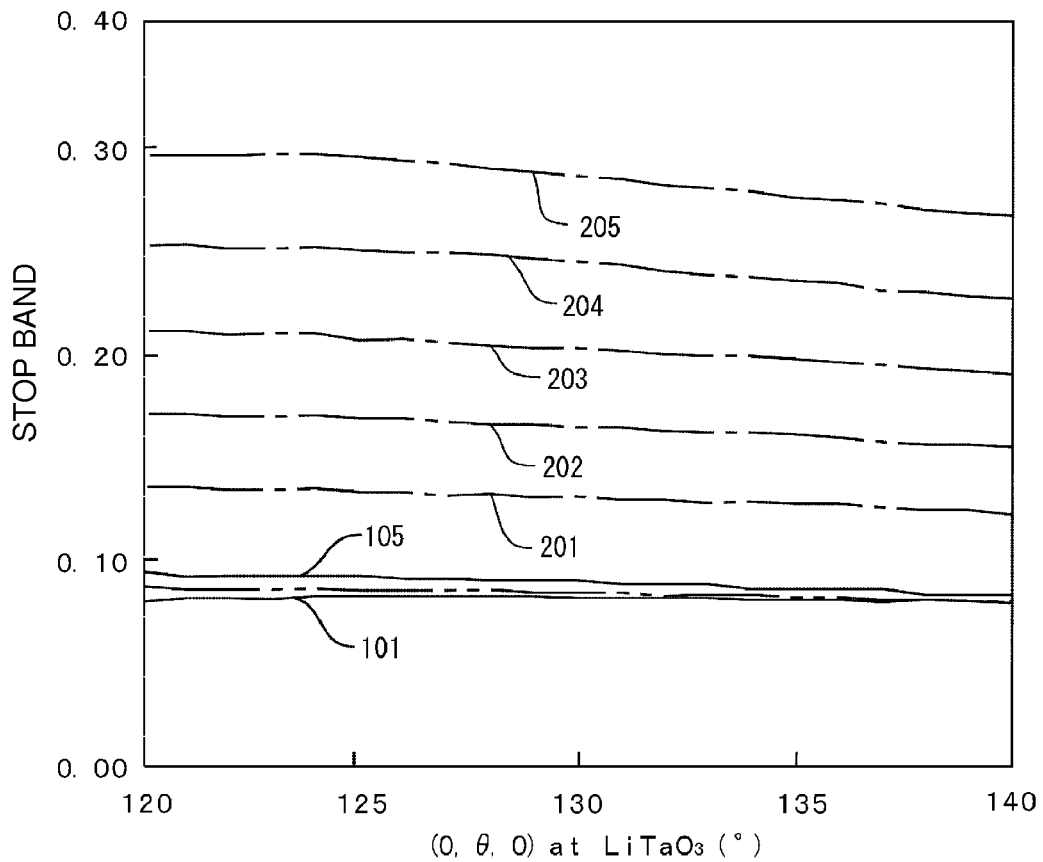
FIG. 9 is a graph showing the stop band in Example 1 and Comparative Examples 1 and 2.

In FIGS. 3, 9, and 10, and FIGS. 11 to 16 which will be described below, the solid line denoted by numeral 101 represents the data in Example 1 in which the second electrode layer 22 thickness normalized to wavelength (h/λ) is about 0.01. The solid line denoted by numeral 102 represents the data in Example 1 in which the second electrode layer 22 thickness normalized to wavelength (h/λ) is about 0.02. The solid line denoted by numeral 103 represents the data in Example 1 in which the second electrode layer 22 thickness normalized to wavelength (h/λ) is about 0.03. The solid line denoted by numeral 104 represents the data in Example 1 in which the second electrode layer 22 thickness normalized to wavelength (h/λ) is about 0.04. The solid line denoted by numeral 105 represents the data in Example 1 in which the second electrode layer 22 thickness normalized to wavelength (h/λ) is about 0.05. The dashed-dotted line denoted by numeral 201 represents the data in the Comparative Example in which the second electrode layer 22 thickness normalized to wavelength (h/λ) is about 0.01. The dashed-dotted line denoted by numeral 202 represents the data in the Comparative Example in which the second electrode layer 22 thickness normalized to wavelength (h/λ) is about 0.02. The dashed-dotted line denoted by numeral 203 represents the data in the Comparative Example in which the second electrode layer 22 thickness normalized to wavelength (h/λ) is about 0.03. The dashed-dotted line denoted by numeral 204 represents the data in the Comparative Example in which the second electrode layer 22 thickness normalized to wavelength (h/λ) is about 0.04. The dashed-dotted line denoted by numeral 205 represents the data in the Comparative Example in which the second electrode layer 22 thickness normalized to wavelength (h/λ) is about 0.05. In FIG. 9, for drawing simplicity, only the solid line denoted by numeral 101 and the solid line denoted by numeral 105 are illustrated.

As is evident from FIG. 3, regardless of the amount of θ of the Euler angles of the piezoelectric substance 10, Example in which the first electrode layer 21 is embedded in the grooves 10a of the piezoelectric substance 10 has greater acoustic velocities than Comparative Example 1. It is evident from this result that by embedding the first electrode layer 21 having a relatively large ($\rho^3 \times C44$)$^{1/2}$ value in the piezoelectric substance 10, the acoustic velocity can be increased.

Figure 6:
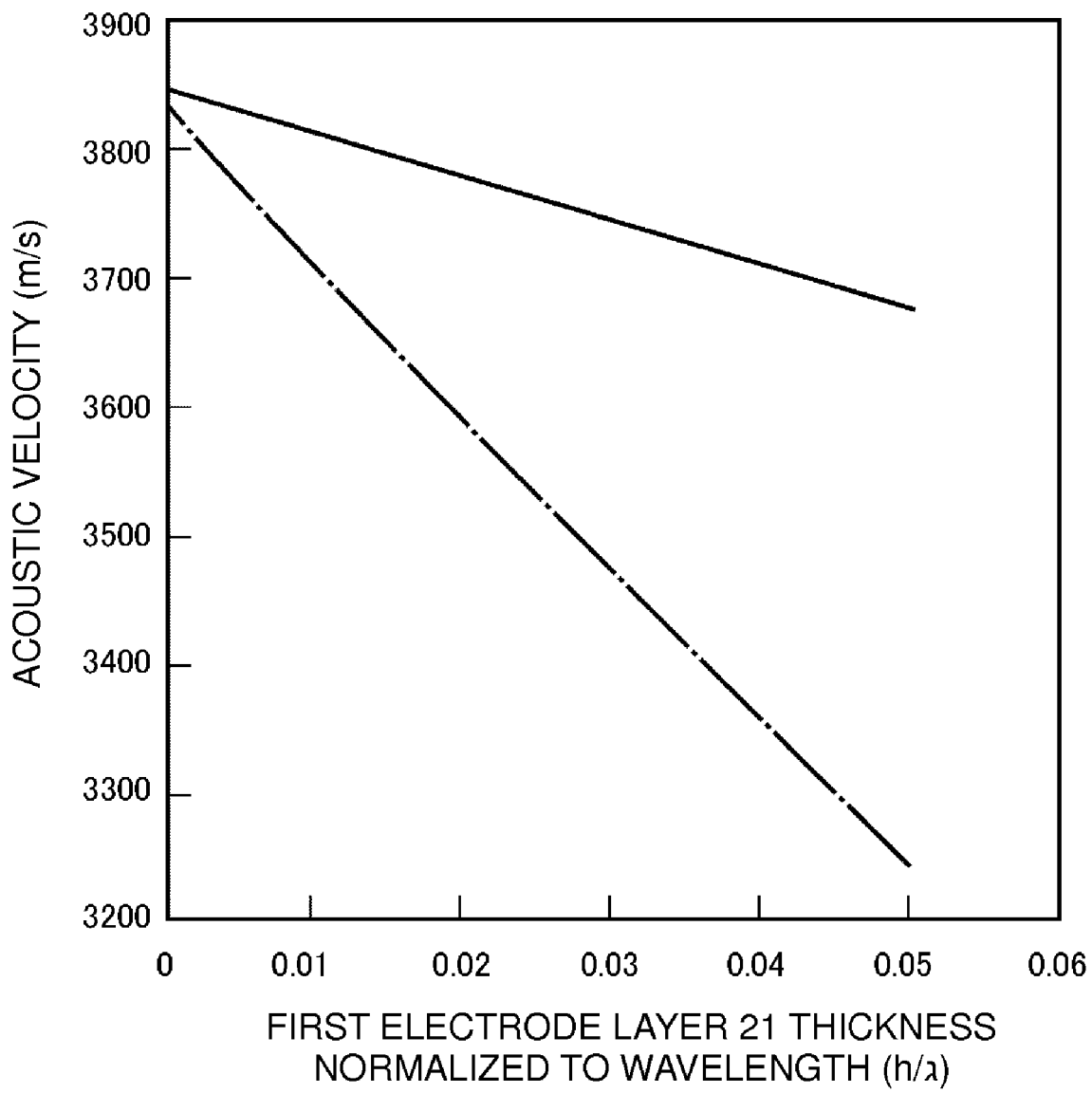
FIG. 6 is a graph showing the relationship between the first electrode layer thickness normalized to wavelength and the acoustic velocity in Example 1 and Comparative Example 1.

Furthermore, as is evident from FIG. 6, in Comparative Example 1 in which the first electrode layer 21 is not embedded in the piezoelectric substance 10, the acoustic velocity decreases sharply as the first electrode layer 21 thickness normalized to wavelength increases. Consequently, in Comparative Example 1, when the first electrode layer 21 thickness normalized to wavelength is increased, the acoustic velocity is decreased. Furthermore, since the acoustic velocity is decreased, in order to achieve a desired frequency, it is necessary to decrease the pitch of the first electrode fingers 31b and the second electrode fingers 32b. Therefore, it is necessary to decrease the cross-sectional areas of the first electrode fingers 31b and the second electrode fingers 32b. Consequently, it is difficult to decrease the resistance of the first electrode fingers 31b and the second electrode fingers 32b. Therefore, in the surface acoustic wave device including the structure of Comparative Example 1, it is difficult to achieve both a low insertion loss and high resistance to static electricity.

Figure 7:
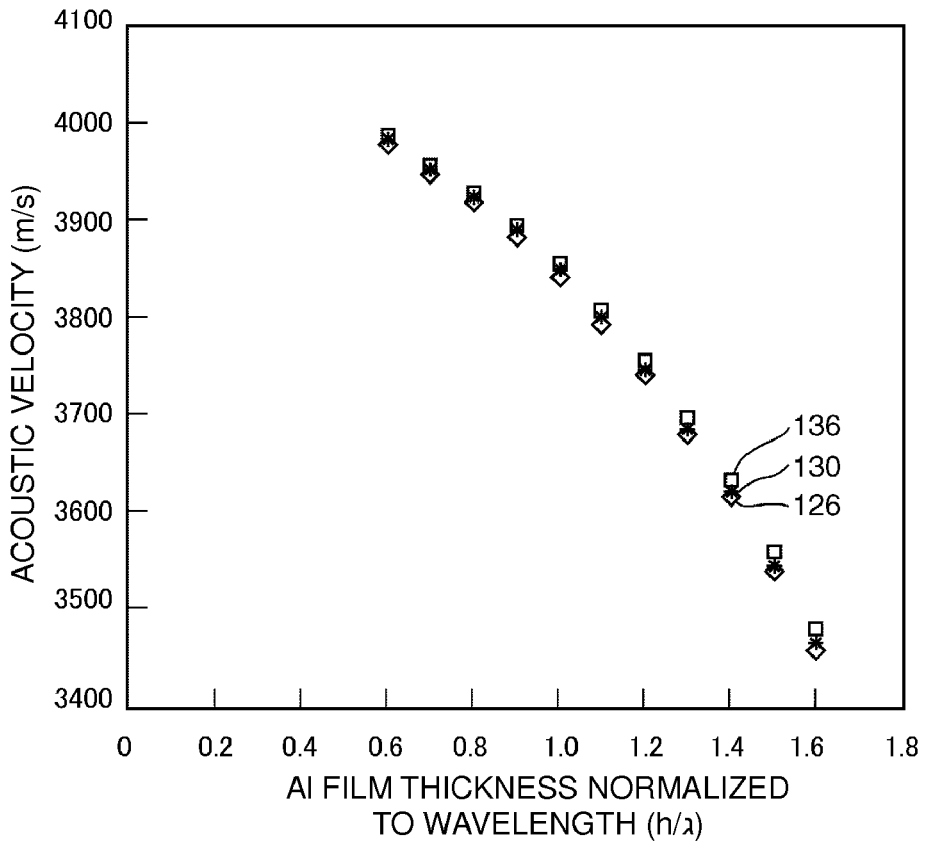
FIG. 7 is a graph showing the relationship between the Al film thickness normalized to wavelength and the acoustic velocity.

Furthermore, as shown in FIG. 7, when the Al electrode layer 40 is provided on the piezoelectric substance 10, as the Al electrode layer 40 thickness normalized to wavelength increases, the acoustic velocity is greatly decreased. Therefore, when the Al electrode layer 40 is provided on the piezoelectric substance 10, as in Comparative Example 1, it is difficult to achieve a small insertion loss and high resistance to static electricity.

In contrast, in Example 1 in which the first electrode layer 21 is embedded in the piezoelectric substance 10, even if the first electrode layer 21 thickness normalized to wavelength increases, the acoustic velocity is not significantly decreased. Therefore, since the pitch of the first electrode fingers 31b and the second electrode fingers 32b can be increased, it is possible to increase the cross-sectional areas of the first electrode fingers 31b and the second electrode fingers 32b.

Figure 8:
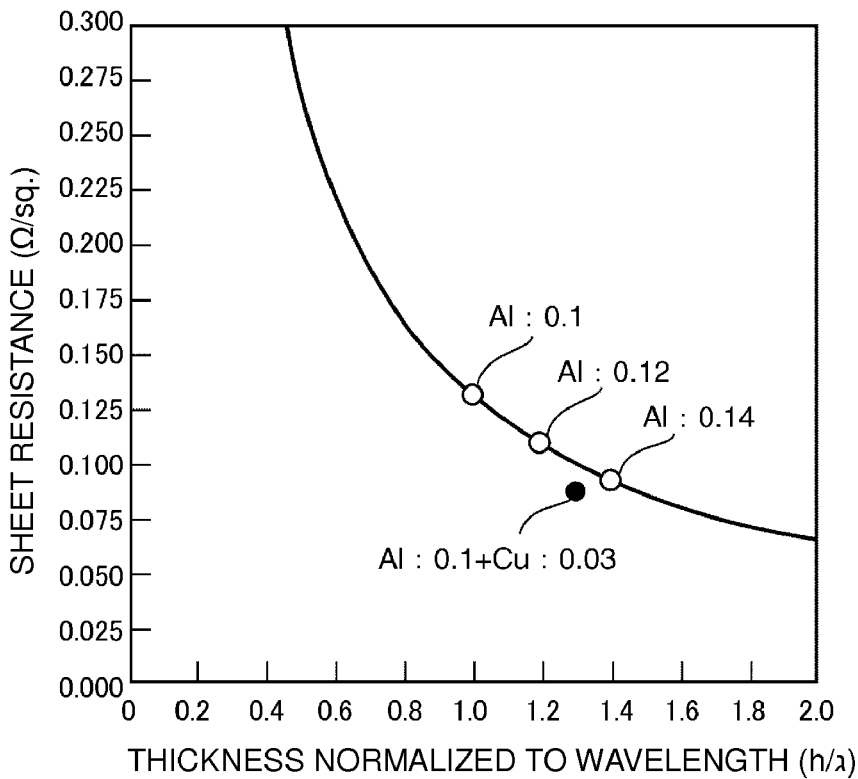
FIG. 8 is a graph showing the relationship between the thickness normalized to wavelength and the sheet resistance.

Furthermore, when the first electrode layer 21 is made of Cu, since Cu has higher conductivity than Al, the sheet resistance of the first electrode fingers 31b and the second electrode fingers 32b can be decreased as compared to when the first electrode fingers 31b and the second electrode fingers 32b are made of an Al electrode layer. Specifically, as shown in FIG. 8, the sheet resistance (Ω/square) of electrode fingers including a first electrode layer 21 made of Cu having a thickness normalized to wavelength of about 0.03 and a second electrode layer 22 made of Al having a thickness normalized to wavelength of about 0.1 is substantially equal to the sheet resistance of an Al film having a thickness normalized to wavelength of about 0.14.

Consequently, in Example 1 in which the first electrode layer 21 is embedded in the piezoelectric substance 10, the electrical resistance of the first electrode fingers 31b and the second electrode fingers 32b can be decreased. Therefore, the insertion loss can be decreased.

Furthermore, in Example 1, since the pitch of the first electrode fingers 31b and the second electrode fingers 32b can be increased, resistance to static electricity can be increased. That is, both high resistance to static electricity and a low insertion loss can be achieved.

Next, with reference to FIG. 9, the stop band in Example 1 and Comparative Examples 1 and 2 will be described. As shown in FIG. 9, in Comparative Example 1 in which the first electrode layer 21 is not embedded in the piezoelectric substance 10, the stop band is relatively large. Consequently, in Comparative Example 1, since the reflection coefficient of the IDT electrode 37 is excessively large, design freedom is significantly reduced. Furthermore, when a longitudinally coupled resonator-type filter is manufactured using the IDT electrode 37, the steepness characteristic of the filter is decreased.

Figure 10:
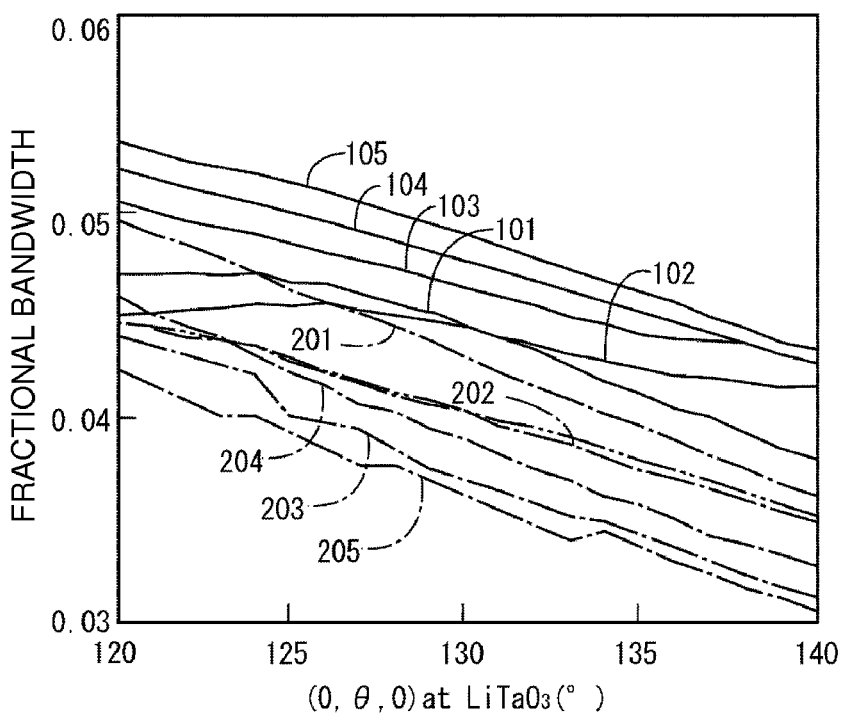
FIG. 10 is a graph showing the fractional bandwidth in Example 1 and Comparative Examples 1 and 2.

Furthermore, the stop band in Example 1 in which the first electrode layer 21 is embedded in the piezoelectric substance 10 is substantially equal to the stop band in Comparative Example 2 in which the Al electrode layer 40, which has been widely used, is provided. Furthermore, as shown in FIG. 10, the fractional bandwidth in Example 1 is substantially equal to the fractional bandwidth in Comparative Examples 1 and 2. Consequently, the existing know-how regarding the surface acoustic wave device in which the Al electrode layer 40 is used can be easily utilized, so as to facilitate the design of surface acoustic wave devices.

Examples 2 and 3 and Comparative Examples 3 and 4

In an Example 2 of a preferred embodiment of the present invention, surface acoustic wave devices having substantially the same structure as that in Example 1 were manufactured except that the material of the first electrode layer 21 was preferably changed to Ti ($(\rho^3 \times C44)^{1/2}$=about $6.54 \times 10^{10}$). The acoustic velocity, the stop band, and the fractional bandwidth were measured.

In Comparative Example 3, surface acoustic wave devices having substantially the same structure as that in Comparative Example 1 were manufactured except that the material of the first electrode layer 21 was changed to Ti. The acoustic velocity, the stop band, and the fractional bandwidth were measured.

Figure 11:
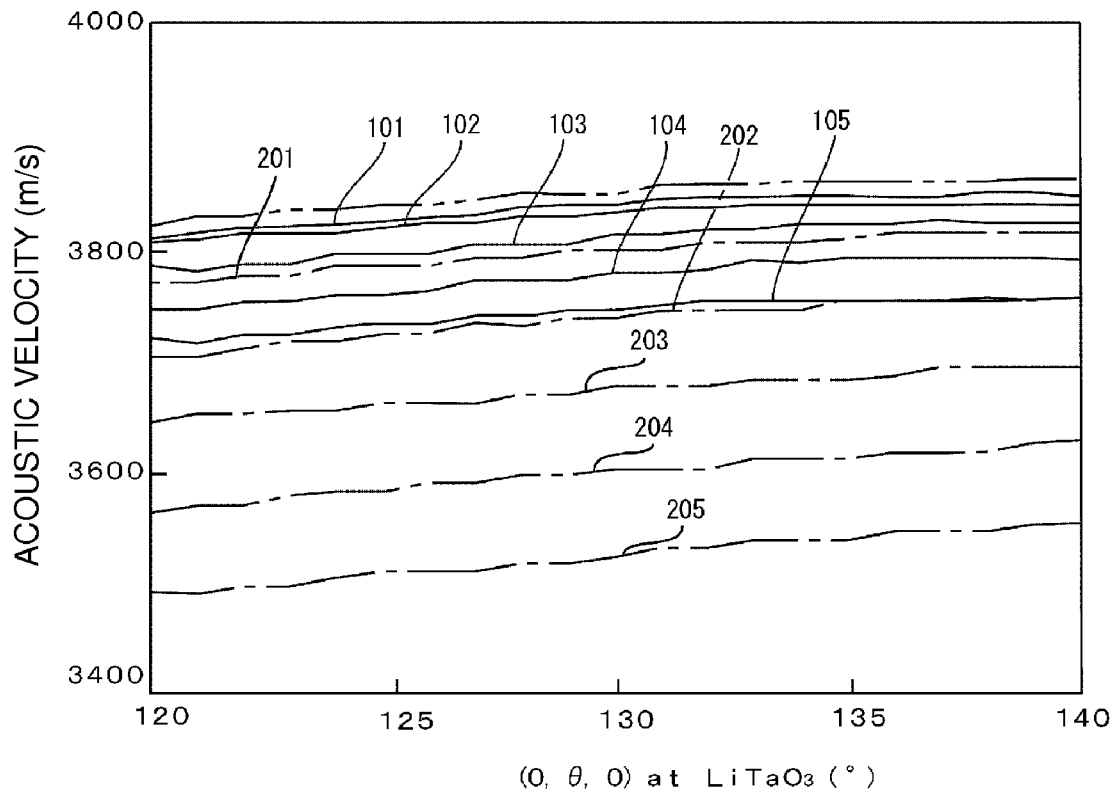
FIG. 11 is a graph showing the acoustic velocity in Example 2 and Comparative Examples 3 and 2.
Figure 12:
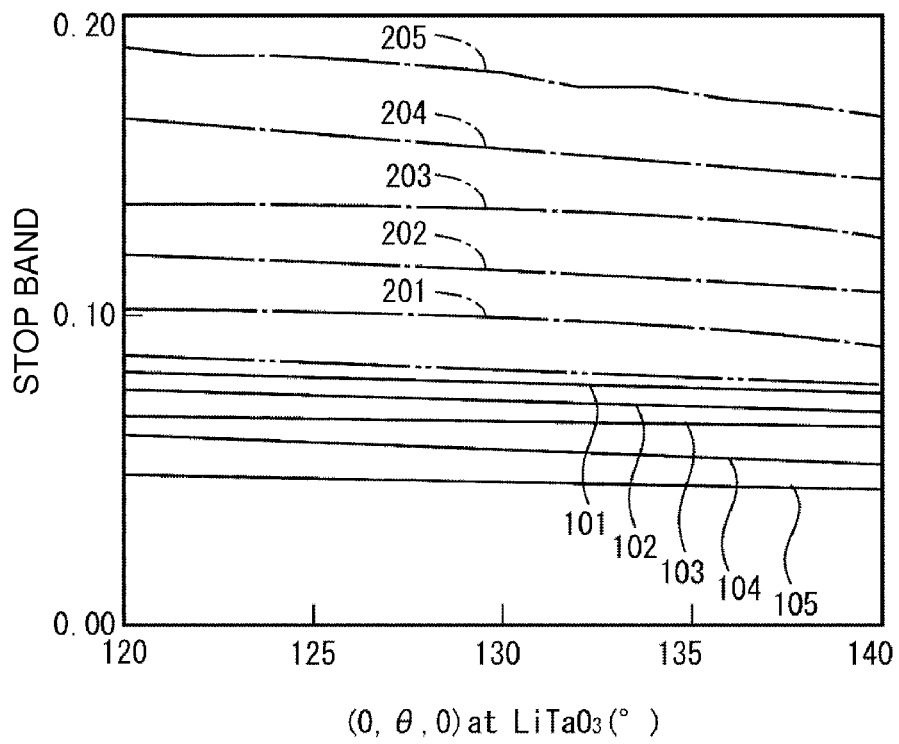
FIG. 12 is a graph showing the stop band in Example 2 and Comparative Examples 3 and 2.
Figure 13:
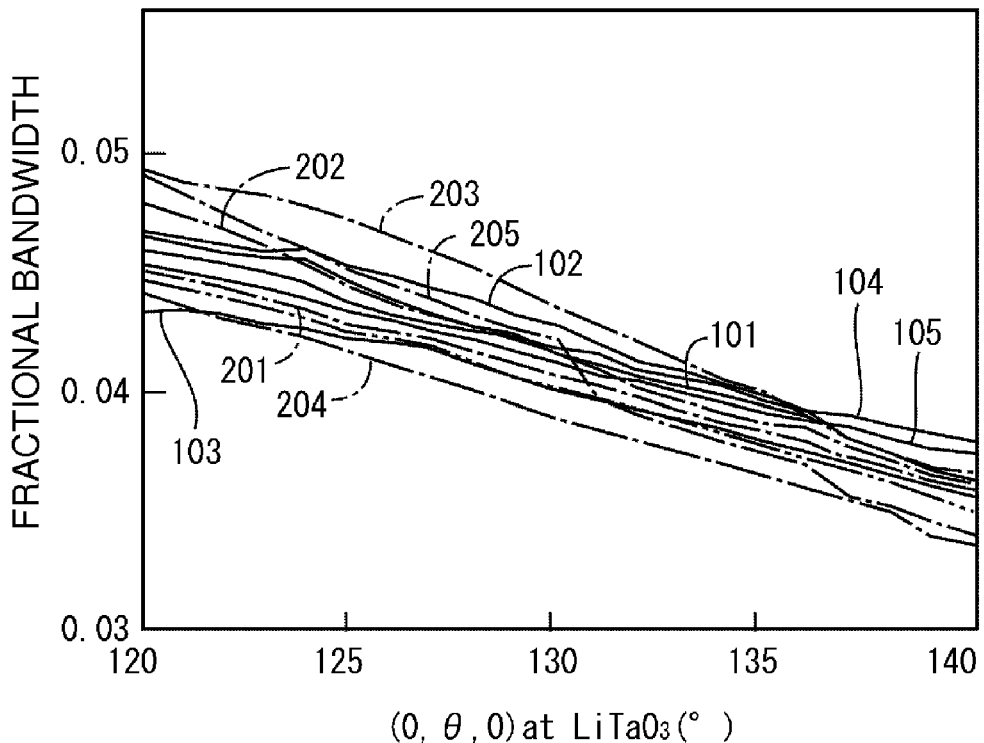
FIG. 13 is a graph showing the fractional bandwidth in Example 2 and Comparative Examples 3 and 2.

The acoustic velocity, the stop band, and the fractional bandwidth in Example 2 and Comparative Example 3 are shown in FIGS. 11 to 13, respectively.

In an Example 3 according to a preferred embodiment of the present invention, surface acoustic wave devices having substantially the same structure as that in Example 1 were manufactured except that the material of the first electrode layer 21 was preferably changed to Ni ($(\rho^3 \times C44)^{1/2}$=about $2.54 \times 10^{11}$). The acoustic velocity, the stop band, and the fractional bandwidth were measured.

In Comparative Example 4, surface acoustic wave devices having substantially the same structure as that in Comparative Example 1 were manufactured except that the material of the first electrode layer 21 was changed to Ni. The acoustic velocity, the stop band, and the fractional bandwidth were measured.

Figure 14:
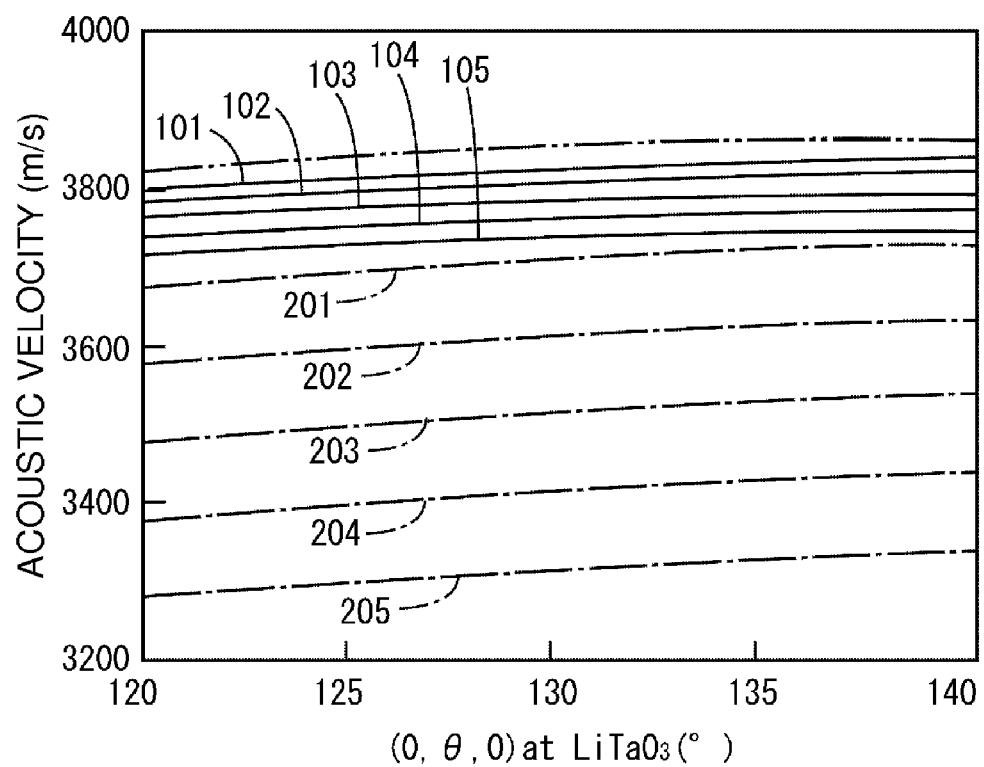
FIG. 14 is a graph showing the acoustic velocity in Example 3 and Comparative Examples 4 and 2.
Figure 15:
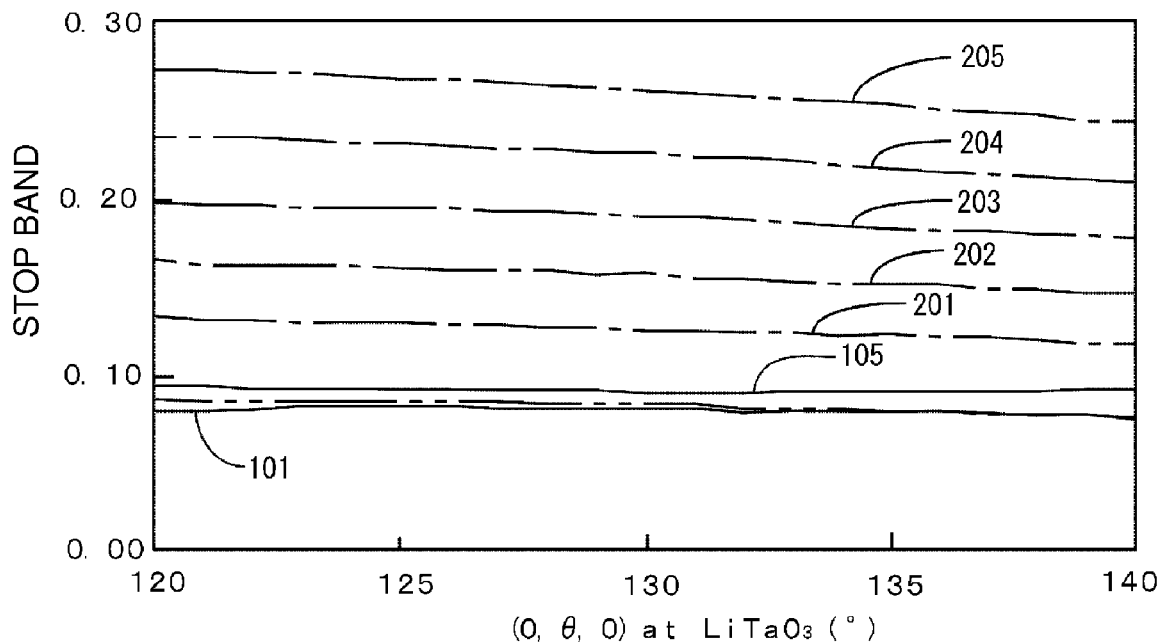
FIG. 15 is a graph showing the stop band in Example 3 and Comparative Examples 4 and 2.
Figure 16:
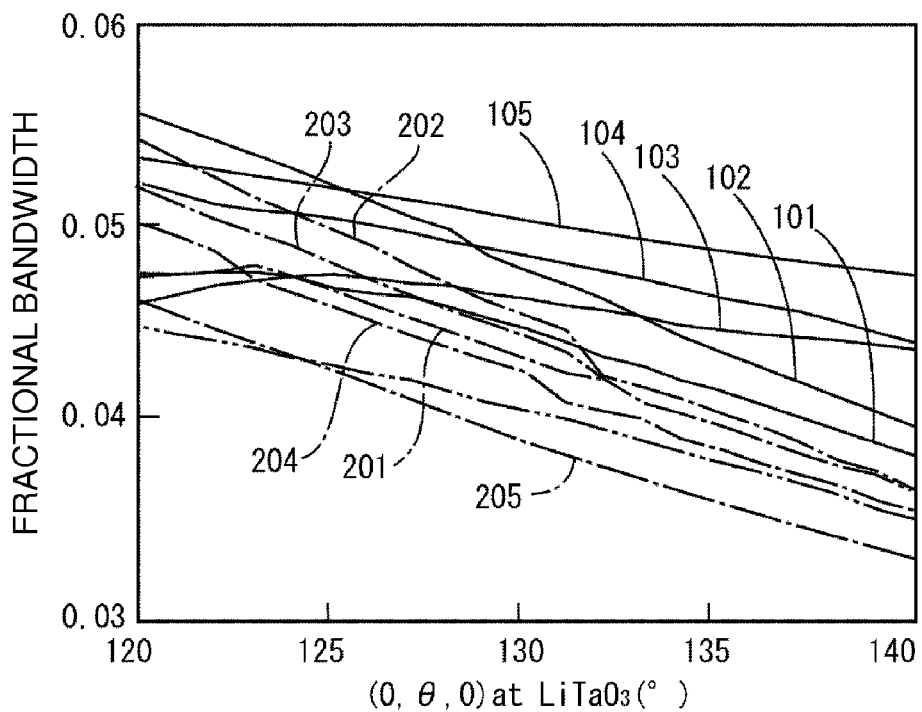
FIG. 16 is a graph showing the fractional bandwidth in Example 3 and Comparative Examples 4 and 2.

The acoustic velocity, the stop band, and the fractional bandwidth in Example 3 and Comparative Example 4 are shown in FIGS. 14 to 16, respectively.

As shown in FIGS. 11 and 14, when the material for the first electrode layer 21 is Ti or Ni, for example, regardless of the amount of θ of the Euler angles of the piezoelectric substance 10, Examples 2 and 3 in which the first electrode layer 21 is embedded in the grooves 10a of the piezoelectric substance 10 have higher acoustic velocities than Comparative Examples 3 and 4. Therefore, both high resistance to static electricity and a small insertion loss can be achieved with Examples 2 and 3.

Furthermore, as shown in FIGS. 12 and 15, the stop band in Examples 2 and 3 in which the first electrode layer 21 is embedded in the piezoelectric substance 10 is substantially equal to the stop band in Comparative Example 2 in which the Al electrode layer 40, which has been widely used, is used. Furthermore, as shown in FIGS. 13 and 16, the fractional bandwidth in Example 2 or 3 is substantially equal to the fractional bandwidth in Comparative Example 2. Consequently, when the material of the first electrode layer 21 is Ti or Ni, for example, the existing know-how regarding the surface acoustic wave device in which the Al electrode layer 40 is used can be easily utilized, so as to facilitate the design of surface acoustic wave devices.

Modified Example

Figure 17:
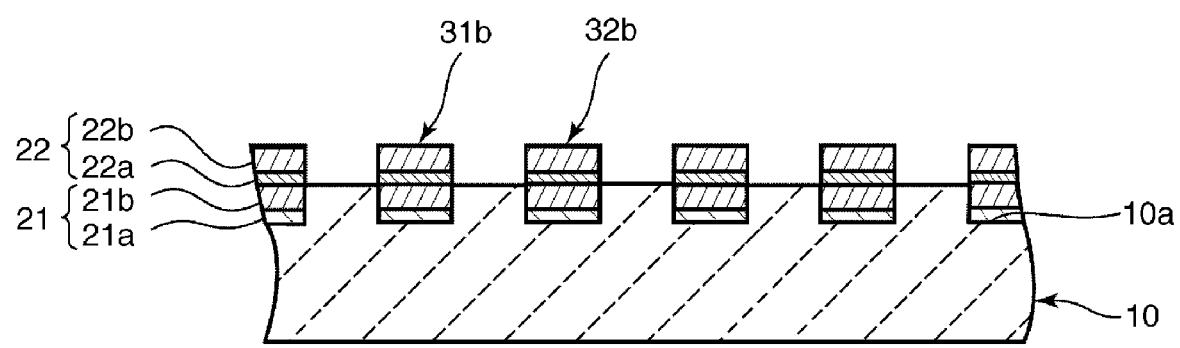
FIG. 17 is a schematic cross-sectional view of a surface acoustic wave device according to a modified example of a preferred embodiment of the present invention.

FIG. 17 is a schematic cross-sectional view of a surface acoustic wave device according to a modified example of a preferred embodiment of the present invention. As shown in FIG. 17, a first electrode layer 21 may preferably include a first metal film 21a and a second metal film 21b, and a second electrode layer 22 may preferably include a first metal film 22a and a second metal film 22b. Even in this case, when the $(\rho_a^3 \times C44_a)^{1/2}$ value of the first electrode layer 21 is greater than the $(\rho_b^3 \times C44_b)^{1/2}$ value of the second electrode layer 22, substantially the same advantageous effects as those in the preferred embodiments described above are obtained.

In addition, in the modified example, $\rho_a$ is obtained by dividing the sum of the product of the density and the thickness of the first metal film 21a and the product of the density and the thickness of the second metal film 21b by the thickness of the first electrode layer 21. C44a is obtained by dividing the sum of the product of the average stiffness and the thickness of the first metal film 21a and the product of the average stiffness and the thickness of the second metal film 21b by the thickness of the first electrode layer 21.

$\rho_b$ is obtained by dividing the sum of the product of the density and the thickness of the first metal film 22a and the product of the density and the thickness of the second metal film 22b by the thickness of the second electrode layer 22. $C44_b$ is obtained by dividing the sum of the product of the average stiffness and the thickness of the first metal film 22a and the product of the average stiffness and the thickness of the second metal film 22b by the thickness of the second electrode layer 22. While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
   a piezoelectric substance including a plurality of grooves in a surface thereof; and
   an IDT electrode including a plurality of electrode fingers partially disposed in the plurality of grooves; wherein
   each of the electrode fingers includes a first electrode layer located in the grooves and a second electrode layer disposed on the first electrode layer and located at a position higher than an upper opening of the grooves; and
   a one-half power of a product of a cube of an average density ($\rho_a$) of the first electrode layer and an average stiffness ($C44_a$) of the first electrode layer $[(\rho_a^3 \times C44_a)^{1/2}]$ is greater than a one-half power of a product of a cube of an average density ($\rho_b$) of the second electrode layer and an average stiffness ($C44_b$) of the second electrode layer $[(\rho_b^3 \times C44_b)^{1/2}]$.

2. The surface acoustic wave device according to claim 1, wherein a relationship $(\rho_b^3 \times C44_b)^{1/2} < 6.54 \times 10^{10} \leq (\rho_a^3 \times C44_a)^{1/2}$ is satisfied.

3. The surface acoustic wave device according to claim 2, wherein the relationship $(\rho_a^3 \times C44_a)^{1/2} < 5.0 \times 10^{11}$ is satisfied.

4. The surface acoustic wave device according to claim 1, wherein the second electrode layer is substantially made of Al or an alloy containing Al as a main component.

5. The surface acoustic wave device according to claim 1, wherein the first electrode layer is substantially made of a metal selected from the group consisting of Ti, Cu, Ag, Cr, Ni, Mo, and Au, or an alloy containing at least one metal selected from the group as a main component.

6. The surface acoustic wave device according to claim 1, wherein the first electrode layer is substantially made of Cu, Ti, Ni, or NiCr.

7. The surface acoustic wave device according to claim 1, wherein at least one of the first electrode layer and the second electrode layer includes a plurality of metal films.

8. The surface acoustic wave device according to claim 1, wherein the piezoelectric substance is a $LiNbO_3$ substrate.

9. The surface acoustic wave device according to claim 1, wherein the piezoelectric substance is a $LiTaO_3$ substrate.

10. The surface acoustic wave device according to claim 9, wherein θ of Euler angles (φ, θ, ψ) of the $LiTaO_3$ substrate is about 120° to about 140°.

* * * * *